(12) United States Patent
Tokuichi

(10) Patent No.: US 7,678,664 B2
(45) Date of Patent: Mar. 16, 2010

(54) METHOD FOR FABRICATING SEMICONDUCTOR DEVICE

(75) Inventor: Noriyuki Tokuichi, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/785,813

(22) Filed: Apr. 20, 2007

(65) Prior Publication Data
US 2007/0298584 A1  Dec. 27, 2007

(30) Foreign Application Priority Data
Jun. 26, 2006  (JP) ............................. 2006-175387

(51) Int. Cl.
*H01L 21/76* (2006.01)

(52) U.S. Cl. ..................... 438/427; 438/424; 438/435; 438/437; 438/700; 438/703

(58) Field of Classification Search ................ 438/424, 438/427, 435, 437, 700, 702, 703, FOR. 118, 438/FOR. 388, FOR. 395
See application file for complete search history.

(56) References Cited

U.S. PATENT DOCUMENTS

| | | | | |
|---|---|---|---|---|
| 6,087,220 A | * | 7/2000 | Rogers et al. ................ | 438/257 |
| 2001/0005620 A1 | * | 6/2001 | Tanigami ..................... | 438/584 |
| 2003/0096439 A1 | * | 5/2003 | Lee et al. ..................... | 438/47 |
| 2005/0142808 A1 | * | 6/2005 | Otsuki ......................... | 438/427 |
| 2006/0270183 A1 | * | 11/2006 | Kim et al. .................... | 438/424 |
| 2007/0054451 A1 | * | 3/2007 | Tanaka ........................ | 438/257 |
| 2007/0164339 A1 | * | 7/2007 | Asano et al. ................. | 257/296 |
| 2007/0241373 A1 | * | 10/2007 | Kuroi et al. .................. | 257/288 |

FOREIGN PATENT DOCUMENTS

| JP | 08-181108 | 7/1996 |
|---|---|---|
| JP | 09-045687 | 2/1997 |

* cited by examiner

*Primary Examiner*—N Drew Richards
*Assistant Examiner*—Joannie A Garcia
(74) *Attorney, Agent, or Firm*—Rabin & Berdo, PC

(57) ABSTRACT

According to a fabrication method for an element isolation structure section, that is, STI, of the present invention, by differing the etching rate of material to be embedded in a narrow-width, that is, a small area trench section (first trench section) formed in a small isolation area, from the etching rate of a material to be embedded in a wide-width (plane shape of larger area) trench section (second trench section) formed in a large isolation area, in the etching step, dishing (recessing) that inevitably occurs in a CMP step can be reduced. Therefore, a STI having a higher level of flatness can be formed. As a result, by simple steps, deterioration of the electrical characteristics of elements that are element-isolated by STI can be reduced. That is to say, not only STI having excellent electrical characteristics, but also a semiconductor device provided with such STI, can be provided at a good level of production yield.

Moreover, according to the fabrication method for STI of the present invention, since excellent in-plane uniformity can be achieved, further miniaturization of the semiconductor device fabrication process can be supported.

3 Claims, 8 Drawing Sheets

METHOD FOR FABRICATING SEMICONDUCTOR DEVICE

CROSS REFERENCE TO RELATED APPLICATION

This application claims the priority of Application No. 2006-175387, filed Jun. 26, 2006 in Japan, the subject matter of which is incorporated herein by reference.

TECHNICAL FIELD OF THE INVENTION

The present invention relates to a fabrication method of an element isolation structure section that isolates a plurality of elements fabricated in a semiconductor substrate from one another, in particular, it relates to so-called shallow trench isolation (hereinafter, referred to as STI).

BACKGROUND OF THE INVENTION

As semiconductor micro-processing technology advances, with the conventional element isolation method according to the LOCOS method, it is becoming difficult to fabricate in a narrower width, that is, in a minute area and at a high level of precision, a plurality of element formation areas (hereinafter, also referred to simply as active areas) to be provided in a unit chip area in which elements are to be formed. In order to solve such a problem, element isolation is conventionally carried out by STI, in which shallow trenches are formed in the semiconductor substrate, and a silicon oxide film is embedded therein.

For example, a semiconductor memory device formed in a single chip is usually provided with a memory cell array area, in which a plurality of memory cells are provided in a matrix, and a logic circuit area, in which a logic circuit for controlling operation of the memory cells is arranged. In the case where these constructions are element-isolated by STI, in general, one, two, or more arbitrarily suitable areas having one, two, or more types of width (area) such as a large isolation area provided in a large area that electrically isolates the memory cell array area from the logic circuit area and that separates them in distance, and a small isolation area that isolates minute elements formed in the memory cell array area from one another, are set.

In a step of planarizing the film structure in the fabrication method of STI, in general, a chemical mechanical polishing (CMP) step is often carried out, and this CMP step often causes an undesirable recess, called dishing, to occur in an oxide film that is embedded in the trench section, especially in the large isolation area.

When dishing occurs in STI, for example, a film material of polysilicon film formed in a gate electrode formation step remains in this dishing. Consequently, there is a risk of deterioration of the electrical characteristics of an element formed in the active area.

Moreover, to attempt removal of the film material remaining in the dishing, so-called over etching needs to be carried out. However, there is, for example, a risk of damaging the gate oxide film formed in the active area due to such over etching, causing deterioration of the electrical characteristics of the element.

In order to solve such problems relating to STI dishing, various kinds of STI fabrication methods have been proposed.

For example, a method for STI formation is known (refer to Unexamined Japanese Patent Publication No. Hei 8-181108) in which, with an object of preventing occurrence of a corrupted portion in the end section of an STI element isolation part due to dishing occurrence, and to avoid problems such as the occurrence of a parasitic transistor due to electric field concentration, and a decrease in dielectric breakdown withstand voltage, a film of a substance having a high etching rate for wet etching is formed on a semiconductor substrate, the substance, which has a high etching rate, in the area corresponding to the element isolation area and the semiconductor substrate are selectively etched by anisotropic etching, and an insulating film is formed on side walls and on a bottom section of the trench formed as a result of this etching, and, having formed a planarization film, wet etching is carried out.

Moreover, there is also a known method for STI formation (refer to Unexamined Japanese Patent Publication No. Hei 9-045687) in which, with an object of preventing dishing from occurring, an insulating film is formed only on the substrate surface excluding inside the trench section formed in the silicon substrate, and silicon oxide films, the film-thickness of which are different inside the trench section and on the insulating film, are formed making a use of substrate dependency, and furthermore, the silicon oxide film that fills in the trench section is planarized making use of a difference in etching rates in an etching step.

According to the STI formation methods disclosed in these Patent Documents, there are problems that the formation steps are complex and the formation work-hours are many.

Therefore, there is a demand for a technique for providing, in a simple process, an element isolation structure that can prevent dishing from occurring and secure excellent in-plane uniformity without detracting from the electrical characteristics of the element formed in the active area, and that can cope with the advancement in micro processing technology.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

The present invention has been achieved in consideration of the above problems. In order to solve the above problems, a fabrication method for an element isolation structure section (STI) of the present invention includes following steps.

Specifically, when fabricating the element isolation structure section, on a substrate having a top surface and a bottom surface that opposes to this top surface, there are set a plurality of element formation areas and an element isolation structure section formation area, which includes a small isolation area and a large isolation area wider than this small isolation area, that isolate the plurality of element formation areas from one another.

On the top surface of this substrate, there is formed a first thermal oxide film. Furthermore, on this first thermal oxide film, there is formed a silicon nitride film.

Next, the silicon nitride film and the first thermal oxide film in the element isolation structure formation area are removed, and trench sections from the top surface of this substrate to inside the substrate that include a first trench section formed in the small isolation area and a second trench section formed in the large isolation area, are formed.

A trench section oxide film that covers the surface of the trench sections is formed. Next, a first oxide film that is embedded inside the first trench section covered by the trench section oxide film, and that covers the trench section oxide film covering inside the second trench section, and that covers exposed surfaces of the silicon nitride film and the first thermal oxide film, is formed.

Next, on the first oxide film, the embedding oxide film that is embedded in the second trench section is formed.

Next, the first oxide film and the embedding oxide film are removed until the silicon nitride film is exposed. At this time, in the element isolation structure section formation area, the two oxide films are removed so that heights thereof become equal to that of the silicon nitride film.

The first oxide film that remains after this removal process forms the filling section that fills in the first trench section of the small isolation area, and the coating section that covers the surface of the second trench section, and the remaining embedding oxide film forms the embedding section that is embedded inside the second trench section where the coating section is provided.

Next, the silicon nitride film is removed and the first thermal oxide film is removed to form a second thermal oxide film on the exposed surface of the substrate from which the first thermal oxide film has been removed.

Next, the second thermal oxide film is removed and the filling section, the coating section, and the embedding section are respectively partially removed. As a result, the filling section, the coating section, and the embedding section of heights equal to that of the exposed surface of the substrate from which the second thermal oxide film has been removed, are formed.

According to a fabrication method for an element isolation structure section, that is, STI, of the present invention, by differing the etching rate of material to be embedded in a narrow-width, that is, a small area trench section (first trench section) formed in a small isolation area, from the etching rate of a material to be embedded in a wide-width (plane shape of larger area) trench section (second trench section) formed in a large isolation area, in the etching step, dishing (recessing) that inevitably occurs in a CMP step can be reduced. Therefore, a STI having a higher level of flatness can be formed. As a result, by simple steps, deterioration of the electrical characteristics of elements that are element-isolated by STI can be reduced. That is to say, not only STI having excellent electrical characteristics, but also a semiconductor device provided with such STI, can be provided at a good level of production yield.

Moreover, according to the fabrication method for STI of the present invention, since excellent in-plane uniformity can be achieved, further miniaturization of the semiconductor device fabrication process can be supported.

DETAILED DISCLOSURE OF THE INVENTION

Figure 1:
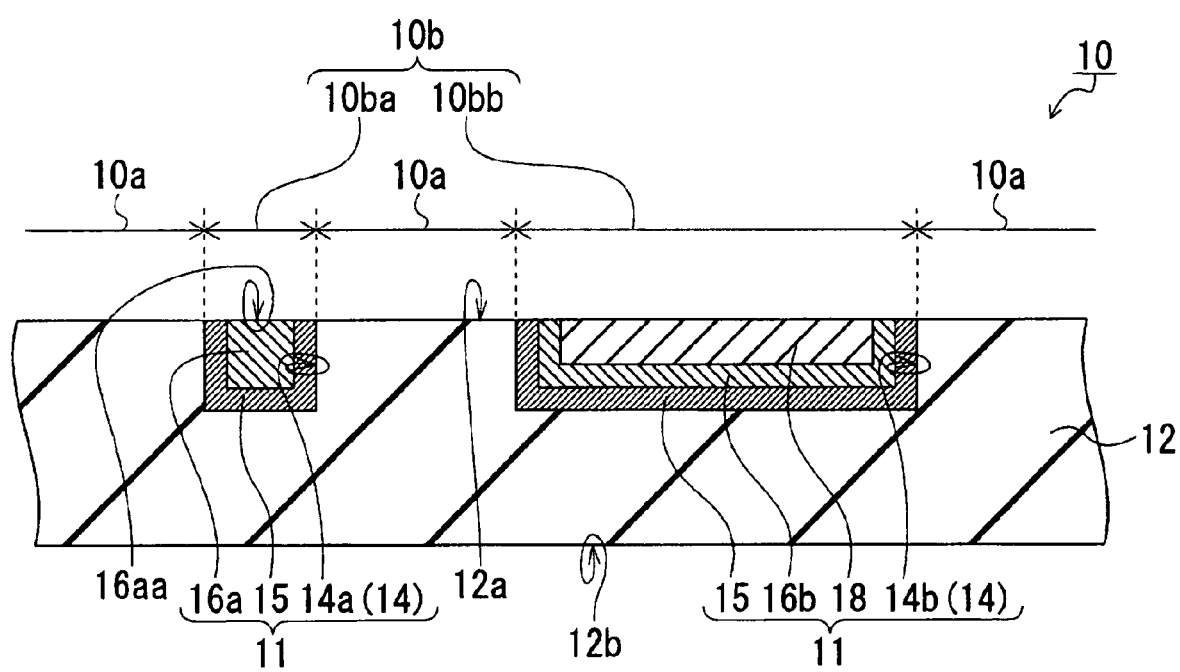
FIG. 1 is a schematic drawing that shows a cross-section of a semiconductor device including an element isolation structure section formed by the method according to the present invention.

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Hereinafter, embodiments of the present invention are described, with reference to the drawings. The drawings only schematically show the shapes, sizes, and arrangement of the each constituent components to a degree sufficient to allow understanding of the present invention, and the present invention is therefore not limited particularly to what is shown in the drawings.

Moreover, specific materials, conditions, and numeric conditions are used in the following description. However, these represent only some of the preferred examples, and the present invention is therefore not limited to these preferred examples.

Furthermore, in each of the drawings used in the following description, it should be understood that the same reference symbols are given to represent similar constituents, and overlapping descriptions thereof may be omitted. The following description explains by way of example, a semiconductor memory device within a unit chip.

First Embodiment (Construction of an Element Isolation Structure Section)

In order to make it easier to understand the present invention, first with reference to FIG. 1, a configuration example of an element isolation structure section obtained by a first method of the present invention is described.

FIG. 1 is schematic drawing of a relevant section that shows a cross-section of a semiconductor device including the element isolation structure section formed by the first method according to the present invention.

The semiconductor device, which is a semiconductor memory device for example, has a large number of elements such as transistors fabricated in a silicon substrate.

As shown in FIG. 1, in order to isolate a plurality of elements, on a substrate 12, there are portioned a plurality of element formation areas 10a (hereinafter, also referred to as first areas), and element isolation structure section formation areas (hereinafter, also referred to as second areas) 10b that electrically isolate these element formation areas 10a from each other.

The first area 10a is an area into which an element is fabricated by the conventionally known wafer process. The second area 10b is an area into which an element isolation structure section 11 that isolates elements from each other is fabricated.

Taking a semiconductor memory device for example, the second area 10b includes a large isolation area 10bb, of larger area, that electrically isolates areas such as a memory cell array area and a logic circuit area from each other and separates them at a distance, and a small isolation area 10ba that isolates elements formed in the memory cell array area. The planar shapes of these small isolation area 10ba and large isolation area 10bb may be arbitrarily made in preferred shapes and sizes according to the semiconductor device to be fabricated.

The element isolation structure section 11 is fabricated in the substrate 12. The substrate 12 is a semiconductor substrate for example, such as a silicon substrate. The substrate 12 has a top surface 12a and a bottom surface 12b that opposes the top surface 12a.

The element isolation structure section 11 has a trench section (hereinafter, referred to simply as trench) 14. There is a plurality of types of the trench sections 14 having several different widths. In the example in the drawing, the trench sections 14 include a first trench section and a second trench section 14a and 14b. These first and second trench sections 14a and 14b are provided in the second area 10b (refer to FIG. 1). The second trench section 14b is formed wider than the first trench section 14a. In this example, the first trench section 14a and the second trench section 14b are formed to the same depth into the substrate 12, that is, from the top surface 12a of the substrate 12 into the thickness of the substrate 12.

The depth, width, sectional shape, and planar extension pattern of the trench sections 14 may be made arbitrarily as preferred in consideration of the functions of the semiconductor device 10 and the electrical characteristics required for the elements to be fabricated therein.

The width of the trench sections 14 in which the previously explained dishing inevitably occurs, is greater than or equal to twice the minimum width of a trench section that can be formed by the generally applied process rule. The general tendency is such that dishing is likely to occur when this width is, for example, greater than or equal to 10 μm on one side (area greater than or equal to 10×10 μm²).

In this example, the depth and width (corresponding to the width shown with the two headed arrow 10ba) of the first trench section 14a are made substantially equal. The width of the first trench section 14a is not particularly limited in principle provided that it can be formed by the process rule to be applied. However, it is approximately 0.5 μm from the point of view of the current state of the art. The depth of the second trench section 14b is equal to that of the first trench section 14a, and the width of the second trench section 14b (corresponding to the two headed arrow 10bb) is greater than or equal to twice the depth.

That is to say, the wide second trench section 14b in this example corresponds to an area having a width of a degree at which dishing inevitably occurs in the CMP step.

In the trench section 14, that is, in the first trench section 14a and the second trench section 14b, along the inner wall surfaces thereof, there is provided a trench section oxide film 15, preferably of uniform thickness. This trench section oxide film 15 is a thermal oxide film for example. This trench section oxide film 15 is provided as a thin film that covers the entire exposed surface of the trench section 14, that is, the side surface and the bottom surface of the trench section 14. This trench section oxide film 15 substantially retains the concave shape of the trench section 14.

The term "trench section" used in the present invention refers not only to a concave shaped structure engraved in the semiconductor substrate, but also to a concave shaped space formed by the trench section oxide film 15 for example, that covers the surface of the concave shape structure.

The film thickness of the trench section oxide film 15 may be arbitrarily made to preference. However, the preferable thickness is 10 nm to 30 nm for example.

In the first trench section 14a covered by the trench section oxide film 15, there is provided a filling section 16a that fills the concave section. A top face 16aa of the filling section 16a has a height the same as that of the top surface (exposed surface) 12a of the substrate 12. Moreover, on the trench section oxide film 15 of the second trench section 14b, there is provided a film shaped coating section 16b that covers the trench section oxide film 15.

As is described in detail later, the filling section 16a and the coating section 16b are of a construction such that they are formed at the same time by the same film formation step. The filling section 16a and the coating section 16b are of a construction having an etching rate greater than that of a filling section 18 that is later provided on the coating section 16b to fill in the second trench section 14b. The filling section 16a and the coating section 16b are preferably constructed from BPSG film (Borophosphosilicate glass: boron phosphorous doped oxide film).

On the coating section 16b, there is provided a filling section 18 that fills the second trench section 14b. The exposed surface of the filling section 18 is a flat plane surface, the height of which is aligned with the top surface 12a of the substrate 12.

The filling section 18 has a configuration such that an etching rate thereof is smaller than that of the filling section 16a and the coating section 16b. The filling section 18 is preferably constructed from a silicon oxide film deposited by a high density plasma CVD (HDPCVD) method.

A plurality of the elements fabricated in the first area 10a of the substrate 12 is isolated by the element isolation structure section 11 having such a structure.

(Fabrication Method of the Element Isolation Structure Section)

Hereinafter, the specific fabrication process of the element isolation structure section of the present invention is described, with reference to FIG. 2, FIG. 3, FIG. 4, and FIG. 5. Each of the drawings schematically shows a cross-sectional cut face of a structure obtained in the fabrication process steps.

Figure 2:
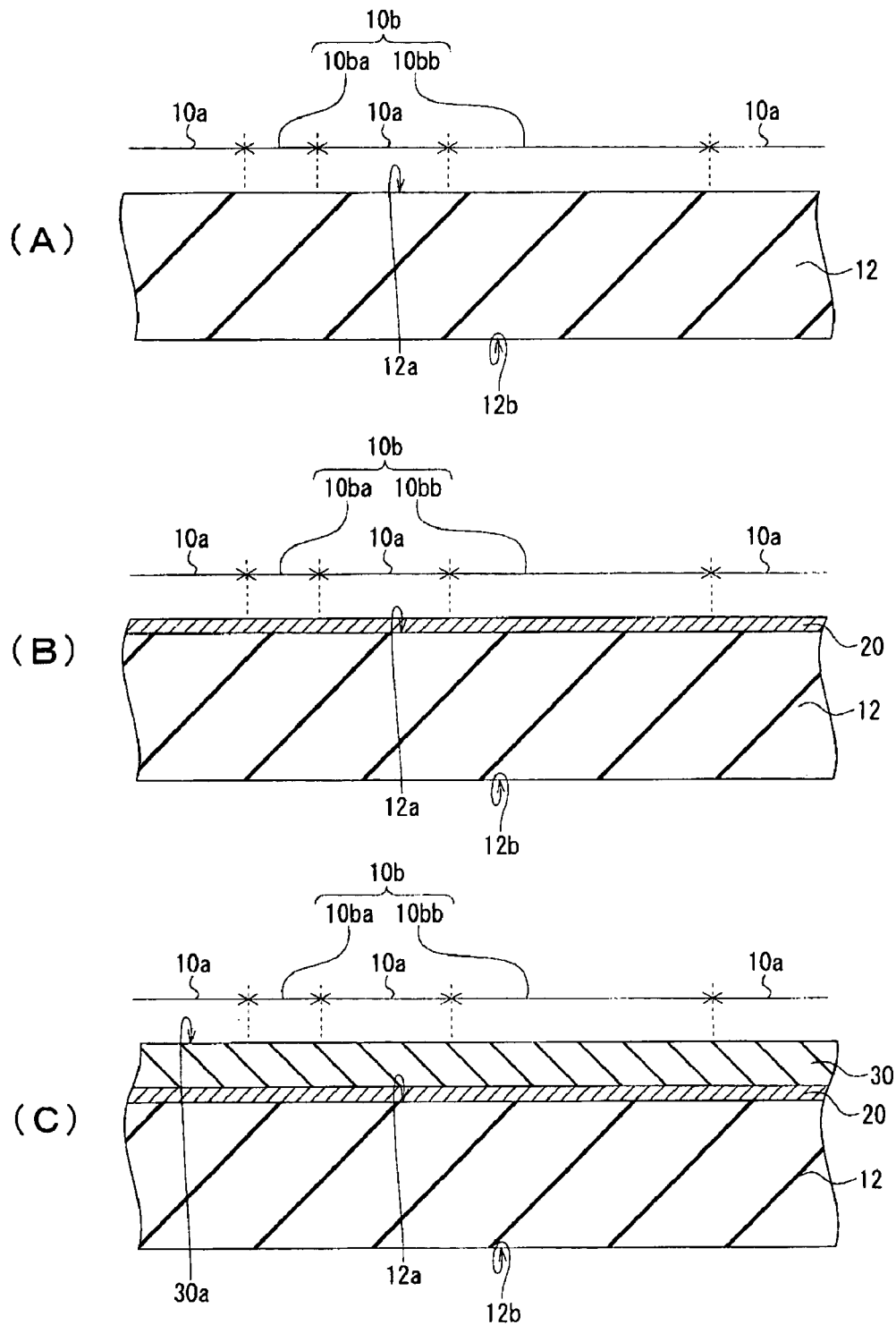
FIGS. 2 (A), (B), and (C) are process drawings for explaining a method of fabricating the element isolation structure section of the present invention.

FIGS. 2 (A), (B) and (C) are schematic drawings of relevant sections that show the cut face of the semiconductor device including the element isolation structure section in the process of fabrication, for explaining a first fabrication method of the present invention.

Figure 3:
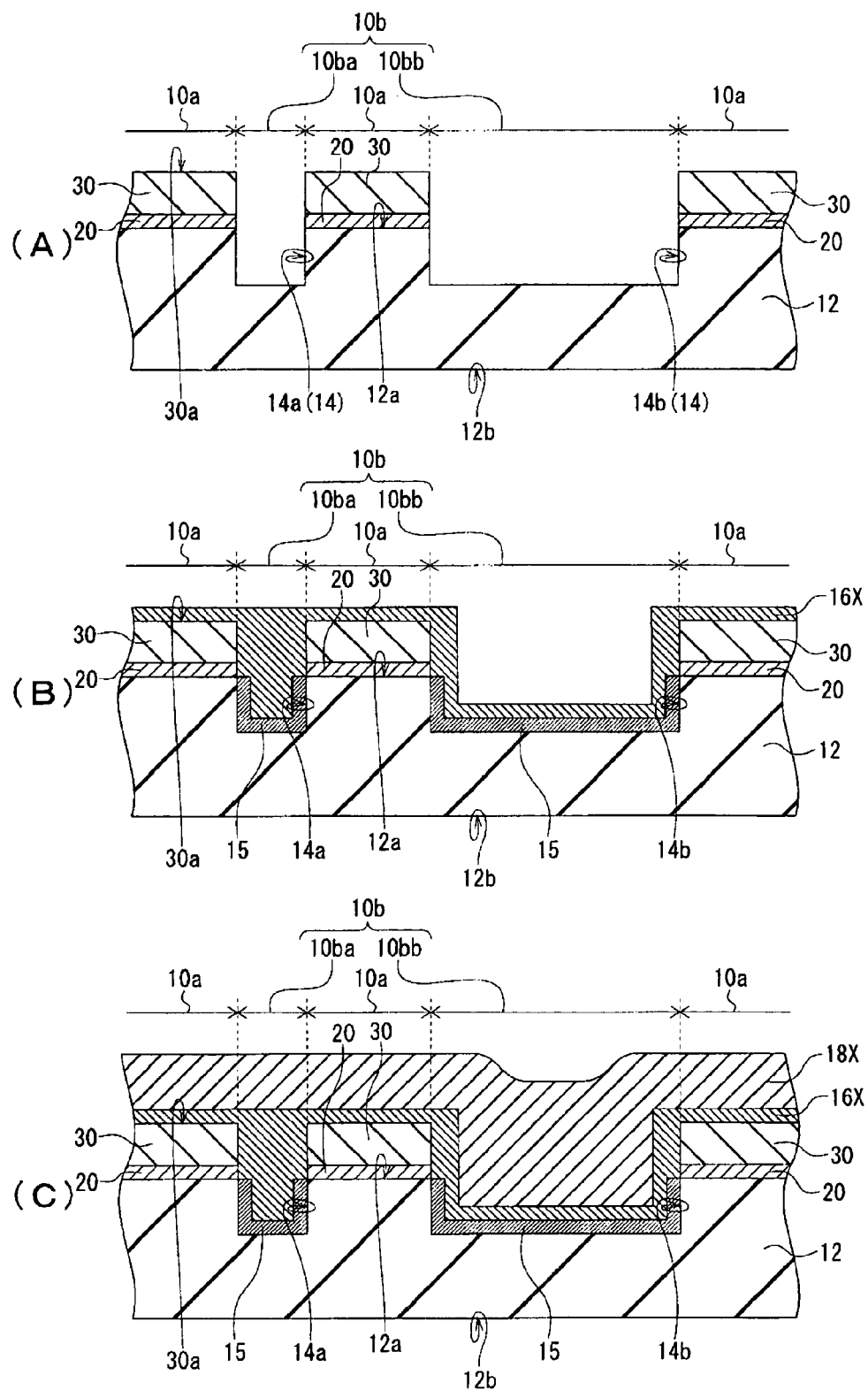
FIGS. 3 (A), (B), and (C) are process drawings that continue from FIG. 2.

FIGS. 3 (A), (B), and (C) are process drawings that continue from FIG. 2 (C).

Figure 4:
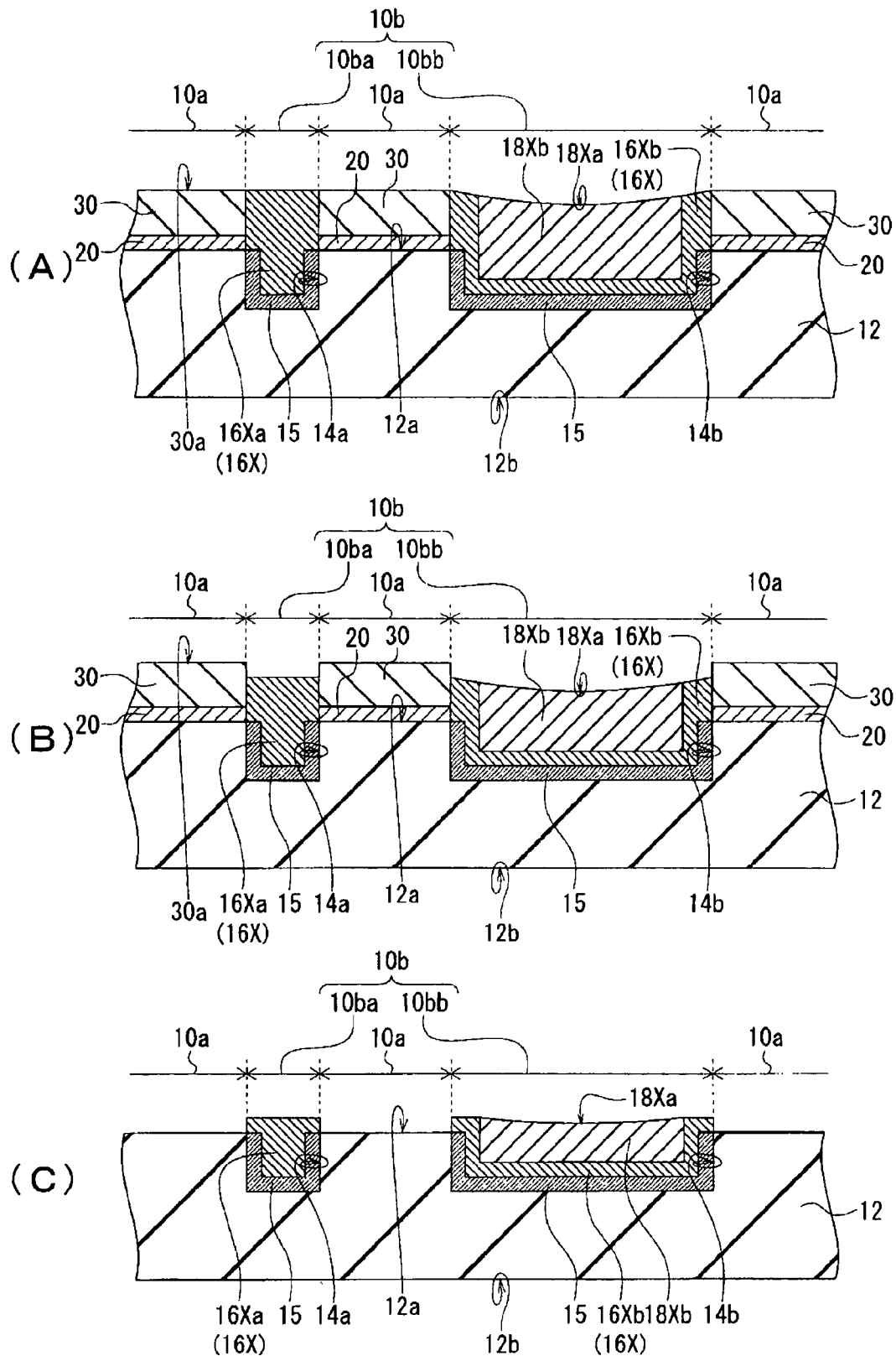
FIGS. 4 (A), (B), and (C) are process drawings that continue from FIG. 3.

FIGS. 4 (A), (B), and (C) are process drawings that continue from FIG. 3 (C).

Figure 5:
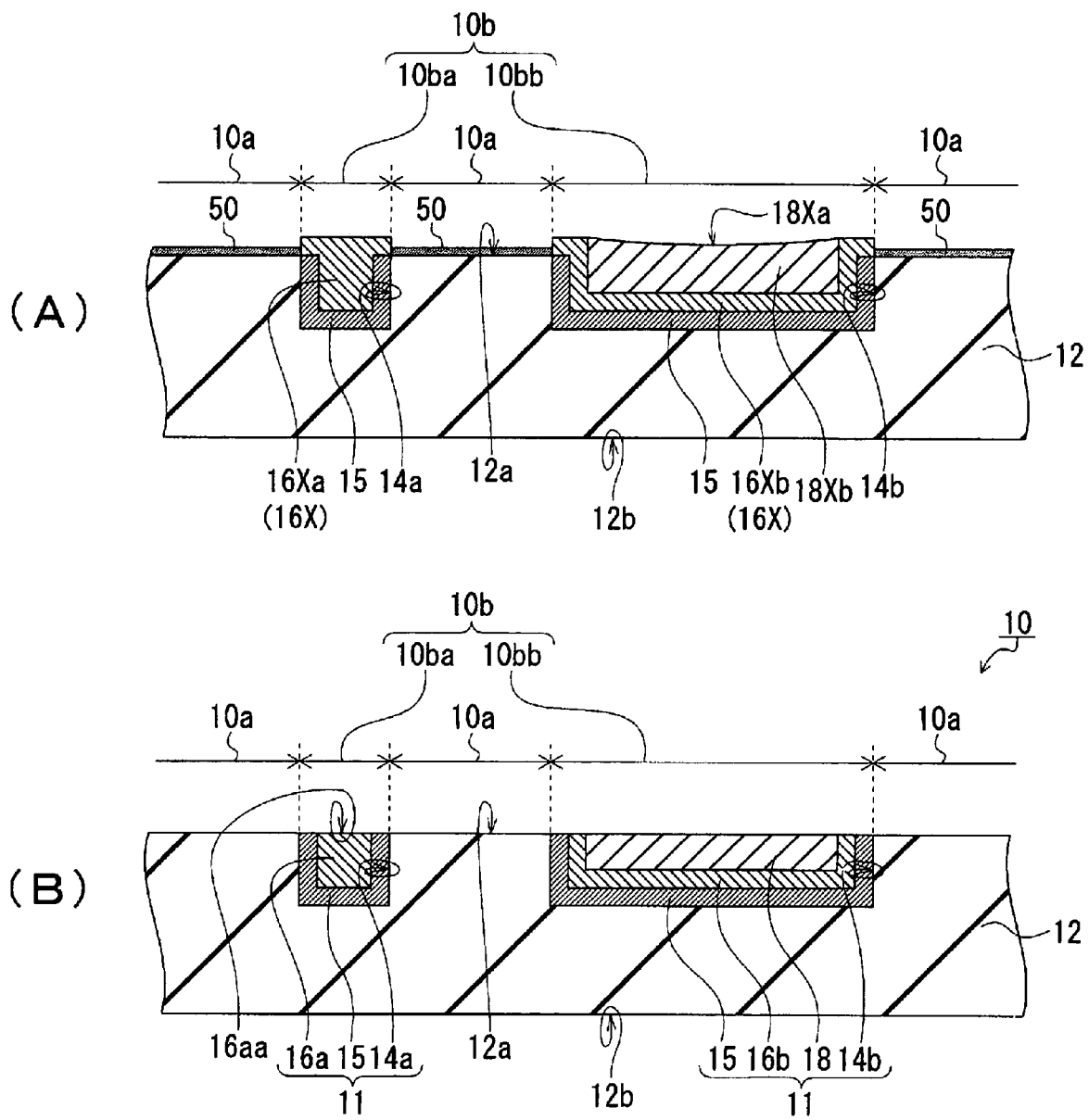
FIGS. 5 (A) and (B) are process drawings that continue from FIG. 4.

FIGS. 5 (A) and (B) are process drawings that continue from FIG. 4 (C).

The substrate 12 is prepared as shown in FIG. 2 (A). On the substrate 12, in accordance with the target design of the semiconductor device 10, there are set the element isolation structure section formation areas, that is, the second areas 10b including the small isolation area 10ba and the large isolation area 10bb, that isolate the plurality of element formation areas, that is, the first areas 10a.

Next, as shown in FIG. 2 (B), a first thermal oxide film 20 is formed on the top surface 12a of the substrate 12. The first thermal oxide film 20 is a so-called pad oxide film. The film thickness of the first thermal oxide film 20 is determined in consideration of the film thickness of a silicon nitride film to be provided thereon. However, it is preferably in a range from approximately 10 nm to 30 nm. In general, if the film thickness of the pad oxide film is approximately one-tenth of the film thickness of the silicon nitride film on the top side thereof, it is thought to be able to prevent an influence of the silicon nitride film on the substrate.

Therefore, the film thickness of the first thermal oxide film 20 needs only to be a film thickness that can substantially prevent adverse effects of a silicon nitride film 30 to be provided atop the first thermal oxide film 20 on the substrate 12.

Next, as shown in FIG. 2 (C), the silicon nitride film 30 is formed on the first thermal oxide film 20. This silicon nitride film 30 can be formed by a low-pressure CVD method for example.

Next, as shown in FIG. 3 (A), the silicon nitride film 30 and the first thermal oxide film 20 that correspond to the second area 10b are removed. This removal step may be carried out in the usual manner by a commonly known photolithography process and etching process.

Further etching is carried out on the substrate surface 12a that has been exposed to the second area 10b as a result of the above removal step to form the trench section 14 from the top surface 12a of the substrate 12 into the thickness of the substrate 12. As a result of this step, the first trench section 14a is formed in the small isolation area 10ba. Moreover, the second trench section 14b is formed in the large isolation area 10bb.

Next, as shown in FIG. 3 (B), a trench section oxide film 15 is formed. The trench section oxide film 15 is a thermal oxide film that covers the surface (inner surface) of the trench section 14 with a substantially uniform thickness. The trench section oxide film 15 may be formed by a commonly known thermal oxidization step in a predetermined suitable condition for the semiconductor device.

Furthermore, the first oxide film 16X is formed. Preferably, the step of forming the first oxide film 16X is to laminate a BPSG film doped with boron (B) and phosphorous (P) by a CVD method under arbitrarily suitable conditions for example. The first oxide film 16X is formed so as to cover all of the exposed surfaces, that is, the exposed first thermal oxide film 20, silicon nitride film 30, and trench section oxide film 15. At this time, in the small isolation area 10ba, the first oxide film 16X is formed so as to pass through the silicon nitride film 30 and the first thermal oxide film 20 with a thickness that fills the concave section that connects to the first trench section 14a, and in the large isolation area 10bb, to pass through the silicon nitride film 30 and the first thermal oxide film 20 with a thickness that covers the surface of the concave section that connects to the second trench section 14 without filling it. The thickness of the first oxide film 16X preferably needs to be approximately half of the width of the first trench section 14a for example.

Next, as shown in FIG. 3 (C), an embedding oxide film 18X is formed on the first oxide film 16X. The embedding oxide film 18X is formed so as to fill in the second trench section 14b covered by the first oxide film 16X.

This embedding oxide film 18X may be formed in the usual manner as a silicon oxide film preferably by a high density plasma CVD method (HDPCVD method) for example.

Furthermore, as shown in FIG. 4 (A), the first oxide film 16X and the embedding oxide film 18X are flattened by a commonly known chemical mechanical polishing (CMP) method that uses the silicon nitride film 30 as an etching stopper film.

As a result of this step, the top surface of the first oxide film 16X of the small isolation area 10ba is shaved off and the height thereof becomes equal to that of the exposed surface of the silicon nitride film 30, that is, the top surface 30a. The remaining section of this first oxide film 16X passes through the silicon nitride film 30 and the first thermal oxide film 20 and fills in the concave section that continues to the first trench section 14a to become the filling section 16Xa. The first oxide film 16X of the large isolation area 10bb has its top surface side shaved off, and the remaining section thereof becomes the coating section 16Xb that covers the surface of the trench section oxide film 15.

As a result of this step, a portion 18Xb of the embedding oxide film 18X that fills in the second trench section 14b remains only on the coating section 16Xb. However, in carrying out the CMP step, a dish shaped recess, that is, a dishing 18Xa, inevitably occurs on the surface of the remaining embedding oxide film 18Xb. As a result, the lowest position in the recess (dishing 18Xa) becomes lower than the height of the top face of the filling section 16Xa.

Next, as shown in FIG. 4 (B), some of the thickness portion is removed from the exposed surfaces of the filling section 16Xa, the coating section 16Xb, and the remaining embedding oxide film 18Xb, so that the newly formed top surfaces of the filling section 16Xa, the coating section 16Xb, and the remaining embedding oxide film 18Xb become lower than the top surface 30a of the silicon nitride film 30. This step is a step for adjusting a height difference after removal of the silicon nitride film 30.

The thicknesses of the filling section 16Xa, the coating section 16Xb, and the remaining embedding oxide film 18Xb to be left after this removal step, are to be reverse-calculated and set so that when the first thermal oxide film 20 has been etching-removed in a latter step and furthermore a second thermal oxide film 50 (refer to FIGS. 5 (B) and (C)), described later, has been etching-removed, as a result of both these etchings, the top surface newly formed after removal of the upper portion of the filling section 16Xa, the coating section 16Xb, and the remaining embedding oxide film 18Xb is in plane with a substrate surface (new exposed surface of the substrate) 12a (refer to FIG. 5 (B)). That is to say, the respective film thicknesses of the filling section 16Xa, the coating section 16Xb, and the embedding oxide film 18Xb to be left remaining at this time are to be set so that their height, given as the product of: the sum of the time for removing the first thermal oxide film 20 and the time for removing the second thermal oxide film 50 (unit: hours), and the etching rate of the filling section 16Xa, the coating section 16Xb, and the embedding oxide film 18Xb under predetermined conditions; projects from the new exposed surface of the substrate after removal of the second thermal oxide film.

Specifically, this step of partially removing the filling section 16Xa, the coating section 16Xb, and the embedding oxide film 18Xb is to be carried out by a commonly known hydrofluoric acid (HF) process. This hydrofluoric acid process is preferably carried out with a concentration of hydrofluoric acid of approximately 5% by mass for example.

Next, as shown in FIG. 4 (C), the silicon nitride film 30 is removed. This removal step is preferably carried out by an etching step using phosphoric acid under commonly known arbitrarily suitable conditions.

Next, the first thermal oxide film 20 is removed. This removal step may be carried out under arbitrarily suitable conditions. Preferably, it may be carried out by a hydrofluoric acid process where the hydrofluoric acid concentration is for example approximately 5 percent by mass.

As a result of this hydrofluoric acid process (wet etching), the first thermal oxide film 20 is removed. However at this time, the filling section 16Xa, the coating section 16Xb, and the embedding oxide film 18Xb are also shaved, and the heights thereof become lower.

As described above, the filling section 16Xa, the coating section 16Xb, and the embedding oxide film 18Xb are of a construction such that etching rates thereof for the hydrofluoric acid etchant differ from one to the other. The difference in etching rates of the filling section 16Xa and the coating section 16Xb respectively for hydrofluoric acid is preferably made as large as possible.

That is to say, in the hydrofluoric acid process carried out twice, the filling section 16Xa and the coating section 16Xb are shaved at a higher speed than the embedding oxide film 18Xb. Since the processing time is still the same, an amount of the embedding oxide film 18Xb smaller than an amount of the filling section 16Xa and the coating section 16Xb to be shaved off is slowly shaved off. Therefore, as a result of these hydrofluoric acid processes, the depth of the dishing 18Xa is reduced.

Furthermore, as shown in FIG. 5 (A), the second thermal oxide film 50 is formed on the exposed surface of the substrate 12 from which the first thermal oxide film 20 has been removed, that is, the first area 12a. This thermal oxidization step is a generic step the purpose of which is to clean the top surface of a substrate before forming a gate oxide film. Therefore, the thermal oxidization step is to be carried out according to arbitrarily suitable conditions.

As a result of forming the second thermal oxide film 50, the height of the first area 10a increases slightly and the substrate surface 12a recedes slightly. That is to say, the thickness of the substrate 12 becomes slightly thinner.

Subsequently, as shown in FIG. 5 (B), the second thermal oxide film 50 is removed. This removal step is to be carried out by a wet etching step similar to the hydrofluoric acid process mentioned above. Preferably, for example, having carried out the hydrofluoric acid process under arbitrarily suitable conditions, water cleaning is carried out, and a commonly known process using hydrochloric acid-hydrogen peroxide water solution (HPM) is carried out with the solution temperature at 70° C. for example.

As a result of this second thermal oxide film 50 removal step using hydrofluoric acid, the filling section 16Xa, the coating section 16Xb, and the embedding oxide film 18Xb are also shaved off at the same time. That is to say, as a result of this step, the filling section 16Xa, the coating section 16Xb, and the embedding oxide film 18Xb are further shaved off, and the heights thereof become substantially equal to that of the exposed surface of the substrate from which the second thermal oxide film 50 has been removed, completing the filling section 16a, the coating section 16b, and an embedding section 18, the heights of which are equal to that of the exposed new top surface 12a. Thereby, the top surface of the element isolation structure section 11 exists on the same plane with the top surface 12a of the substrate 12.

Subsequently, the substrate 12 is spin-dried.

As a result of the above steps, the element isolation structure section 11 of the present invention is completed.

Hereinafter, a wafer process is carried out following the usual method, and elements such as a transistor are fabricated in the element formation area, thereby fabricating the semiconductor device 10 having a desired configuration.

According to the fabrication method of STI of the present invention, the etching rate in the (isotropic) wet etching step may be different for each area. Specifically, by making the etching rate of the large isolation area 10bb, where so called dishing inevitably occurs, smaller than the etching rate of the small isolation area 10ba, etching is carried out slowly for the large isolation area 10bb, that is, the dishing. Therefore, by effectively reducing the depth of the dishing (recess), planarization of the substrate can be improved, and furthermore, deterioration of the electrical characteristics of the semiconductor device can be reduced, and moreover, production yield can be improved.

Second Embodiment (Construction of an Element Isolation Structure Section)

Figure 6:
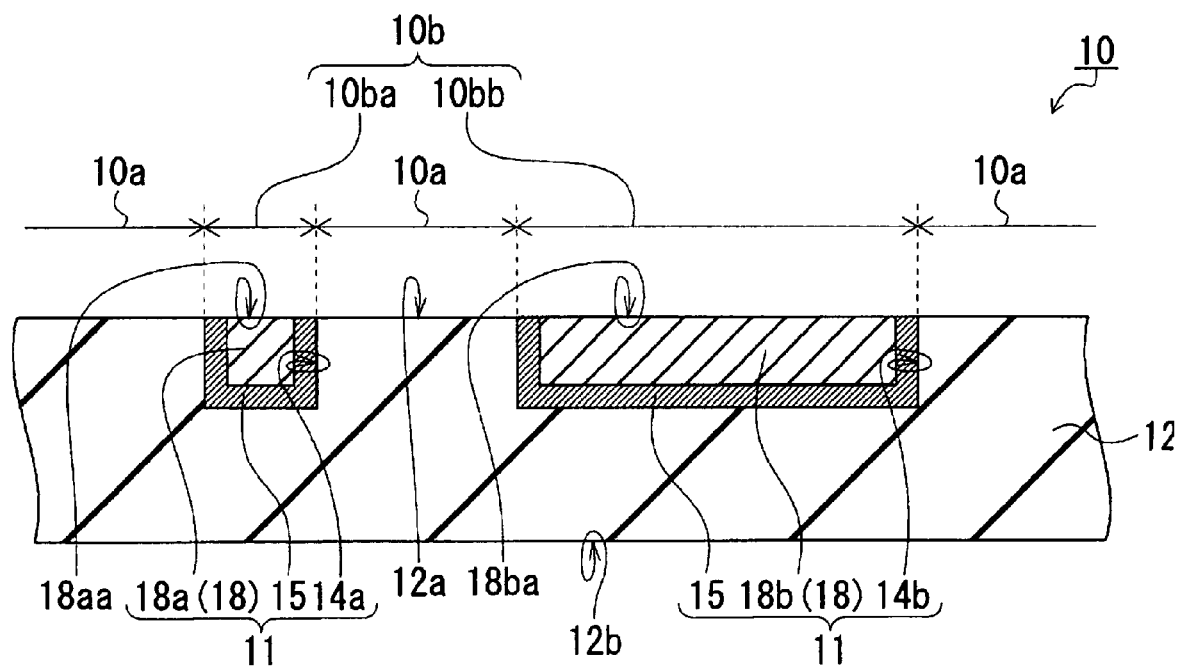
FIG. 6 is a schematic drawing that shows a cross-section of a semiconductor device including an element isolation structure section formed by the method according to the present invention.

First with reference to FIG. 6, a configuration example of an element isolation structure section obtained by a second method of the present invention is described.

FIG. 6 is schematic drawing of a relevant section that shows a cross-section of a semiconductor device including the element isolation structure section formed by the second method according to the present invention. Structures similar to those of the first embodiment are denoted by the same reference symbols, and their detailed descriptions are omitted.

As shown in FIG. 6, in order to isolate a plurality of elements, on a substrate 12, there are portioned a plurality of element formation areas 10a, that is, first areas, and element isolation structure section formation areas, that is, second areas 10b that electrically isolate these element formation areas 10a from each other.

The first area 10a is an area into which an element is fabricated by the conventionally known wafer process. The second area 10b is an area into which an element isolation structure section 11 that isolates elements from each other is fabricated.

Taking a semiconductor memory device for example, the second area 10b includes, similar to that described for the first embodiment, a small isolation area 10ba, and a large isolation area 10bb with a larger width than that of the small isolation area. The large isolation area 10bb of larger area, electrically isolates areas such as a memory cell array area and a logic circuit area from each other and separates them at a distance, and the small isolation area 10ba isolates elements formed in the memory cell array area. The planar shapes of these small isolation area 10ba and large isolation area 10bb may be arbitrarily made in preferred shapes and sizes according to the semiconductor device to be fabricated.

The element isolation structure section 11 is fabricated in the substrate 12. The substrate 12 is a semiconductor substrate for example, such as a silicon substrate. The substrate 12 has a top surface 12a and a bottom surface 12b that opposes the top surface 12a.

The element isolation structure section 11 has a trench section 14. There is a plurality of types of the trench sections 14 having several different widths. In the example in the drawing, the trench sections 14 include a first trench section 14a provided in a second area 10b, and a second trench section 14b formed wider than the first trench section 14a, and provided in a first area 10a. In this example, the first trench section 14a and the second trench section 14b are formed to the same depth into the substrate 12, that is, from the top surface 12a of the substrate 12 into the thickness of the substrate 12.

The depth, width, sectional shape, and planar extension pattern of the trench sections 14 may be made arbitrarily as preferred in consideration of the functions of the semiconductor device 10 and the electrical characteristics required for the elements to be fabricated therein.

The width of the trench sections 14 in which the previously explained dishing inevitably occurs, is greater than or equal to twice the minimum width of a trench section that can be formed by the generally applied process rule.

In this example, the depth and width (corresponding to the width shown with the two headed arrow 10ba) of the first trench section 14a are substantially equal. The width of the first trench section 14a need only be a width that it can be formed by the process rule to be applied. The depth of the second trench section 14b is equal to that of the first trench section 14a, and the width of the second trench section 14b (corresponding to the two headed arrow 10bb) is greater than or equal to twice the depth.

That is to say, the wide second trench section 14b in this example corresponds to an area of a width at which dishing inevitably occurs in the aforementioned CMP step.

In the trench section 14, that is, in the first trench section 14a and the second trench section 14b, along the inner wall surfaces thereof, there is provided a trench section oxide film 15, preferably of uniform thickness. This trench section oxide film 15 is a thermal oxide film for example. This trench section oxide film 15 is provided as a thin film that covers the entire exposed surface of the trench section 14, that is, the side surface and the bottom surface of the trench section 14. This trench section oxide film 15 substantially retains the concave shape of the trench section 14.

The term "trench section" used in the present invention refers not only to a concave shaped structure engraved directly in the semiconductor substrate, but also to a concave shaped space formed by the trench section oxide film 15 for example, that covers the surface of the concave shape structure.

The film thickness of the trench section oxide film 15 may be arbitrarily made to preference. However, the preferable thickness is within a range from 10 nm to 30 nm for example.

In the trench section 14, there is provided an embedding section 18. In the first trench section 14a covered by the trench section oxide film 15, there is provided a first embedding section 18a that fills in the concave section. A top face 18aa of the first embedding section 18a has a height the same as that of the top surface (exposed surface) 12a of the substrate 12. Moreover, on the trench section oxide film 15 of the second trench section 14b, there is provided a second embedding section 18b that is embedded on top of the trench section oxide film 15. A top face 18ba of the second embedding section 18b has a height the same as that of the top surface (exposed surface) 12a of the substrate 12.

The first embedding section 18a and the second embedding section 18b have structures that are formed by the same film formation step at the same time, and detailed description of this is mentioned later.

The filling section 18 is preferably constructed from a silicon oxide film deposited by a high density plasma CVD (HDPCVD) method.

A plurality of the elements fabricated in the first area 10a of the substrate 12 is isolated by the element isolation structure section 11 having such a structure.

(Fabrication Method of the Element Isolation Structure Section)

Hereinafter, the specific fabrication process of the element isolation structure section of the present invention is described, with reference to FIG. 7, and FIG. 8. Each of the drawings schematically shows a cross-sectional cut face of a structure obtained in the fabrication process steps.

Figure 7:
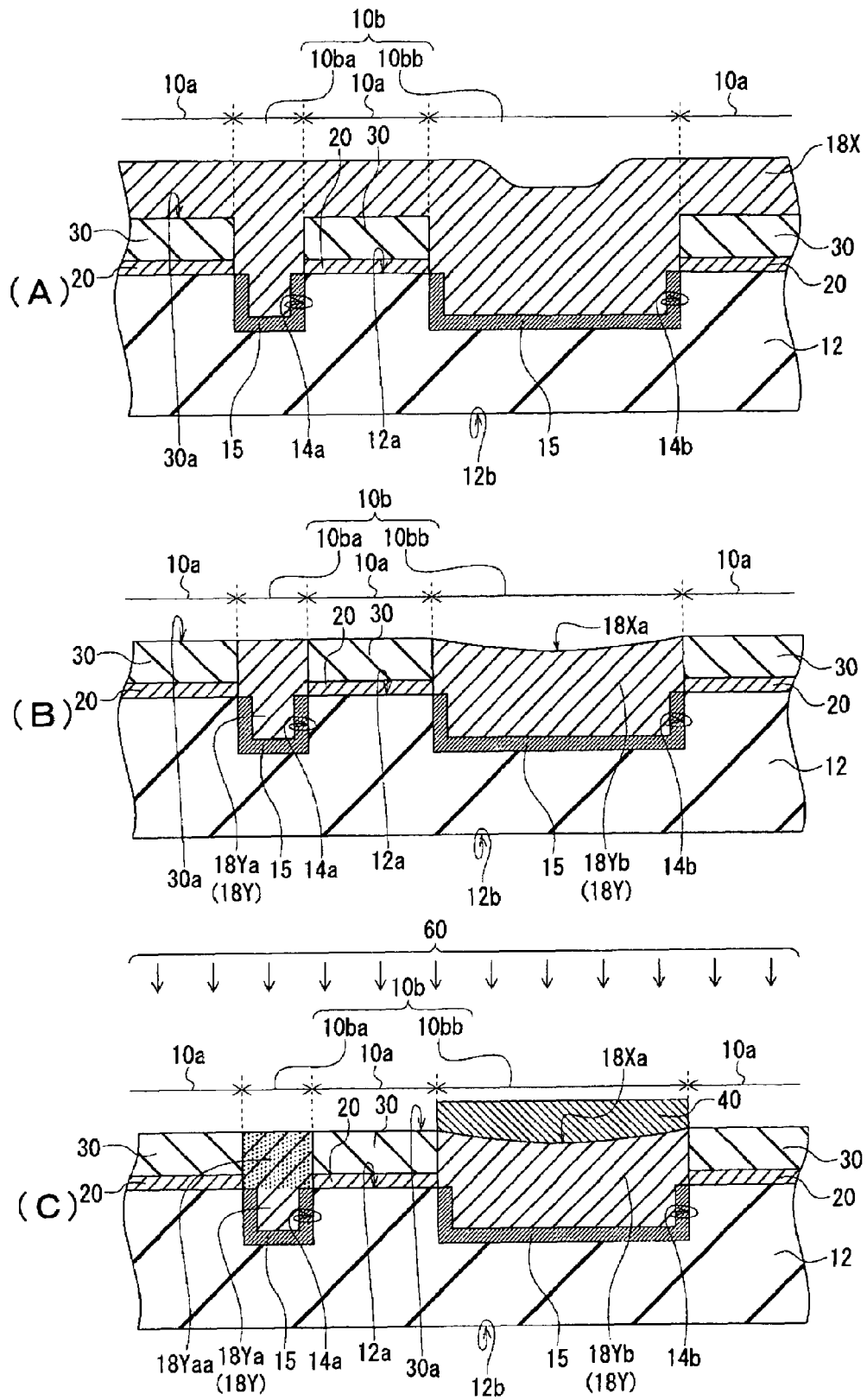
FIGS. 7 (A), (B), and (C) are process drawings for explaining a method of fabricating the element isolation structure section of the present invention.

FIGS. 7 (A), (B) and (C) are process drawings for explaining a second fabrication method of the present invention.

Figure 8:
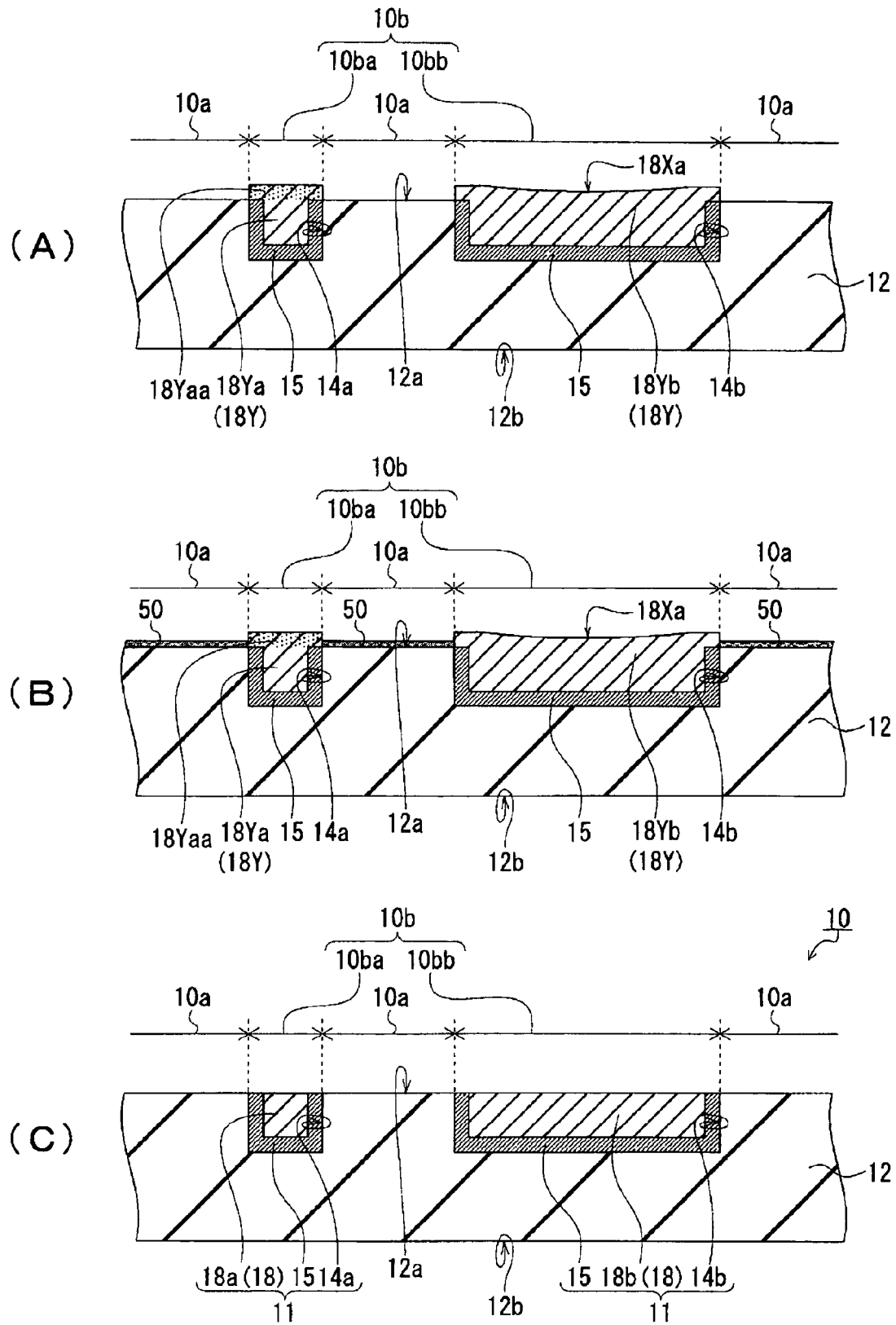
FIGS. 8 (A), (B), and (C) are process drawings that continue from FIG. 7.

FIGS. 8 (A), (B), and (C) are process drawings that continue from FIG. 7 (C).

The same steps as for the first embodiment are executed up until the step for forming the trench section oxide film 15 in the trench section 14. Therefore, diagrams are omitted here, and description refers to FIG. 2 and FIG. 3 (A).

The substrate 12 is prepared as shown in FIG. 2 (A). On the substrate 12, in accordance with the target design of the semiconductor device 10, there are set the element isolation structure section formation areas, that is, the second areas 10b including the small isolation area 10ba and the large isolation area 10bb, that isolate the plurality of element formation areas, that is, the first areas 10a.

Next, as shown in FIG. 2 (B), a first thermal oxide film 20 is formed on the top surface 12a of the substrate 12. The first thermal oxide film 20 is a so-called pad oxide film. The film thickness of the first thermal oxide film 20 is determined in consideration of the film thickness of a silicon nitride film to be provided thereon. However, it is preferably in a range from approximately 10 nm to 30 nm. In general, if the film thickness of the pad oxide film is approximately one-tenth of the film thickness of the silicon nitride film on the top side thereof, it is thought to be able to prevent an influence of the silicon nitride film on the substrate.

Therefore, the film thickness of the first thermal oxide film 20 needs only to be a film thickness that can substantially prevent adverse effects of a silicon nitride film 30 to be provided atop the first thermal oxide film 20 on the substrate 12.

Next, as shown in FIG. 2 (C), the silicon nitride film 30 is formed on the first thermal oxide film 20. This silicon nitride film 30 can be formed by a low-pressure CVD method for example.

Next, as shown in FIG. 3 (A), the silicon nitride film 30 and the first thermal oxide film 20 that correspond to the second area 10b are removed. This removal step may be carried out in the usual manner by a commonly known photolithography process and etching process.

Further etching is carried out on the substrate surface 12a that has been exposed to the second area 10b as a result of the above removal step to form the trench section 14 from the top surface 12a of the substrate 12 into the thickness of the substrate 12. As a result of this step, the first trench section 14a is formed in the small isolation area 10ba. Moreover, the second trench section 14b is formed in the large isolation area 10bb.

Next, as shown in FIG. 7 (A), a trench section oxide film 15 is formed. The trench section oxide film 15 is a thermal oxide film that covers the inside of the trench section 14. The trench section oxide film 15 is formed by a commonly known thermal oxidization step in a predetermined suitable condition for the semiconductor device.

Next, the embedding oxide film 18X is formed. The embedding oxide film 18X is formed so as to cover all of the exposed surfaces on the substrate 12, that is, the exposed first thermal oxide film 20, silicon nitride film 30, and trench section oxide film 15. The embedding oxide film 18X is formed so as to pass through the silicon nitride film 30 and the first thermal oxide film 20 and fill the concave section that connects to the first trench section 14a, and in the large isolation area 10bb, to pass through the silicon nitride film 30 and the first thermal oxide film 20 and fill the surface of the concave section that connects to the second trench section 14.

This embedding oxide film 18X may be formed in the usual manner as a silicon oxide film preferably by a high density plasma CVD method (HDPCVD method) for example.

Furthermore, as shown in FIG. 7 (B), the embedding oxide film 18X is flattened by a commonly known chemical mechanical polishing (CMP) method that uses the silicon nitride film 30 as an etching stopper film.

As a result of this step, the top surface of the embedding oxide film 18X of the small isolation area 10ba and the large isolation area 10bb is shaved off and an oxide film of height equal to that of the exposed surface of the silicon nitride film 30, that is, the top surface 30a remains as 18Ya and 18Yb. That is, the embedding oxide film 18X, in the small isolation area 10ba, passes through the silicon nitride film 30 and the first thermal oxide film 20 and fills in the concave section that continues to the first trench section 14a to become the first embedding section 18Ya. Moreover, in the large isolation area 10bb, it passes through the silicon nitride film 30 and the first thermal oxide film 20 and fills in the concave section that continues to the first trench section 14a to become the second embedding section 18Yb.

However due to this CMP step, a dish shaped recess, that is, a dishing 18Xa, inevitably occurs on the surface of the second embedding section 18Yb. As a result, the lowest position in the recess (dishing 18Xa) becomes lower than the height of the top face of the first embedding section 18Ya.

Next, as shown in FIG. 7 (C), on the second embedding section 18Yb where dishing occurs, there is formed a resist mask 40 that covers the second embedding section 18Yb. The resist mask 40 is formed as a film using an arbitrarily suitable resist material and is to be patterned in a shape that covers the second embedding section 18Yb by a conventional commonly known lithography step.

The area to be covered by the resist mask 40 may be formed so as to reach the silicon nitride film 30. That is to say, the pattern of this resist mask 40 may be a pattern that only exposes the first embedding section 18Ya because only the first embedding section 18Ya need be exposed.

Moreover, in a case such as a semiconductor memory device, in which a memory cell area where there is not an area where dishing occurs is to be isolated from another area where dishing does not occur, the resist mask 40 need only be formed to cover a portion area where an area in which dishing occurs is present.

Next, with the resist mask 40 as a mask, ions 60 are ion-implanted into the area exposed from the resist mask 40. This ion-implantation step is carried out with an object of varying the etching rate of the exposed surface of the first embedding section 18Yb, down to a certain depth, by implanting ions into the first embedding section 18Ya.

This ion-implanting step is to be a step of for example implanting arsenic (As) ions in the usual manner using a commonly known ion implantation device.

A portion area of the first embedding section 18Ya into which ions have been implanted in this ion implanting step is also refereed to as an ion implantation section 18Yaa. The depth (thickness) of the ion implantation section 18Yaa is sufficient if it is on a level (height) equal to that of the top surface of the substrate 12.

If the first embedding section 18Ya is the remaining portion of the silicon oxide film formed by a high density plasma CVD method (HDPCVD method), the etching rate of the ion implantation section 18Yaa, formed by implanting arsenic ions, for hydrofluoric acid as an etchant is greater than the etching rate of the silicon oxide film that constructs the second embedding section 18Yb for hydrofluoric acid under the same conditions.

Next, as shown in FIG. 8 (B), after the resist mask 40 is removed in the usual manner, the silicon nitride film 30 is removed. This removal step for the silicon nitride film 30 is preferably carried out by an etching step using phosphoric acid under commonly known arbitrarily suitable conditions.

Next, the first thermal oxide film 20 is removed. This removal step may be carried out under arbitrarily suitable conditions. Preferably, it may be carried out by a hydrofluoric acid process where the hydrofluoric acid concentration is for example approximately 5 percent by mass.

As a result of this hydrofluoric acid process (wet etching), the first thermal oxide film 20 is removed. However at this time, the ion implantation section 18Yaa and the second embedding section 18Yb are also shaved, and the heights thereof become lower.

As described above, the ion implantation section 18Yaa and the second embedding section 18Yb are of a construction such that etching rates thereof for the hydrofluoric acid etchant differ from one to the other.

That is to say, in this hydrofluoric acid process, the ion implantation section 18Yaa is shaved at a higher speed than the second embedding section 18Yb. Since the processing time is still the same, an amount of the second embedding section 18Yb smaller than an amount of the ion implantation section 18Yaa to be shaved off is slowly shaved off. Therefore, as a result of these hydrofluoric acid processes, the depth of the dishing 18Xa is reduced.

Furthermore, as shown in FIG. 8 (B), the second thermal oxide film 50 is formed on the exposed surface of the substrate 12 from which the first thermal oxide film 20 has been removed, that is, the first area 12a. This thermal oxidation step is a generic step the purpose of which is to clean the top surface of a substrate before forming a gate oxide film. Therefore, the thermal oxidation step may be carried out in the usual manner.

As a result of forming the second thermal oxide film 50, the height of the first area 10a increases slightly and the substrate surface 12a recedes slightly. That is to say, the thickness of the substrate 12 becomes slightly thinner.

Subsequently, as shown in FIG. 8 (C), the second thermal oxide film 50 is removed. This removal step is to be carried out by a wet etching step similar to the hydrofluoric acid process mentioned above. Preferably, for example, having carried out the hydrofluoric acid process under arbitrarily suitable conditions, water cleaning is carried out, and a commonly known process using hydrochloric acid-hydrogen peroxide water solution (HPM) is carried out with the solution temperature at 70° C. for example.

As a result of this second thermal oxide film 50 removal step using hydrofluoric acid, the ion implantation section 18Yaa and the second embedding section 18Yb are also shaved off at the same time. That is to say, as a result of this step, the ion implantation section 18Yaa and the second embedding section 18Yb are further shaved off, and the heights thereof become substantially equal to that of the exposed surface of the substrate from which the second thermal oxide film 50 has been removed, completing the embedding section 18 including the first embedding section 18a and the second embedding section 18b, the heights of which are equal to that of the exposed new top surface 12a.

Subsequently, the substrate 12 is spin-dried.

As a result of the above steps, the element isolation structure section 11 of the present invention is completed.

Hereinafter, a wafer process is carried out following the usual method, and elements such as a transistor are fabricated in the element formation area, thereby fabricating the semiconductor device 10 having a desired configuration.

According to the fabrication method of STI of the present invention, the etching rate in the (isotropic) wet etching step may be made different for each area, by a simple step, without further adding a film forming step. Specifically, by making the etching rate of the large isolation area 10bb, where so called dishing (recessing) inevitably occurs, smaller than the etching rate of the small isolation area 10ba, etching is carried out slowly for the large isolation area 10bb, that is, the dishing. Therefore, by effectively reducing the depth of the dishing, planarization of the substrate can be improved, and furthermore, deterioration of the electrical characteristics of the semiconductor device can be reduced, and moreover, production yield can be improved.

What is claimed is:

1. A method for fabricating a semiconductor device comprising the steps of:
    setting on a substrate having a top surface and a bottom surface that opposes said top surface, a plurality of element formation areas and an element isolation structure section formation area, the element isolation structure section formation area including a small isolation area and a large isolation area wider than said small isolation area, that isolate said plurality of element formation areas from one another;
    forming on said top surface of said substrate, a first thermal oxide film;
    forming on said first thermal oxide film, a silicon nitride film;
    removing said silicon nitride film and said first thermal oxide film in said element isolation structure formation area, and forming trench sections from said top surface of said substrate to inside the substrate, that include a first trench section formed in said small isolation area and a second trench section formed in said large isolation area;
    forming a trench section oxide film that covers a surface of said trench sections;
    forming an embedding oxide film that covers exposed surfaces of said silicon nitride film and said first thermal oxide film, and that covers said trench section oxide film, and that embeds said trench sections;
    removing said embedding oxide film until said silicon nitride film is exposed, and forming an embedding section that includes a remaining first embedding section that embeds said first trench section, and a second embedding section that embeds said second trench section;
    forming a resist mask on said second embedding section and performing ion implantation on said first embedding section to adjust an etching rate of said first embedding section;
    removing said resist mask;
    removing said silicon nitride film;
    removing said first thermal oxide film;
    forming a second thermal oxide film on an exposed surface of said substrate from which said first thermal oxide film has been removed; and
    removing said second thermal oxide film and respectively partially removing said first embedding section, and said second embedding section, forming a filling section including the first embedding section and the second embedding section, and forming, based on the adjustment by the ion implantation of the etching rate of said first embedding section, a flush planar surface between the first embedding section, the second embedding section, and the substrate.

2. A method for fabricating a semiconductor device according to claim 1, wherein said step for adjusting an etching rate of said first embedding section is a step for making a selection ratio with respect to the etching rate of said second embedding section within a range from 2 to 10.

3. A method for fabricating a semiconductor device according to claim 1, wherein
    said step for forming said embedding oxide film is a step for forming a silicon oxide, and
    said step for adjusting an etching rate of said first embedding section is a step for adjusting the etching rate with respect to hydrofluoric acid as an etchant, by implanting arsenic ions.

* * * * *